United States Patent
Damphousse et al.

(10) Patent No.: US 7,138,935 B1
(45) Date of Patent: Nov. 21, 2006

(54) LOW NOISE DIGITAL TO SIGNAL INTERVAL CONVERTER WITH AUDIO APPLICATIONS

(75) Inventors: Simon Damphousse, Kelowna (CA); A. Martin Mallinson, Kelowna (CA); Dustin D. Forman, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 11/236,205

(22) Filed: Sep. 26, 2005

(51) Int. Cl.
*H03M 1/66* (2006.01)
(52) U.S. Cl. .................................. 341/144; 341/143
(58) Field of Classification Search ......... 341/150–172
See application file for complete search history.

(56) References Cited

U.S. PATENT DOCUMENTS

| | | | |
|---|---|---|---|
| 5,337,338 A * | 8/1994 | Sutton et al. ............... | 341/152 |
| 5,559,467 A | 9/1996 | Smedley | |
| 5,903,871 A | 5/1999 | Terui et al. | |
| 5,974,089 A | 10/1999 | Tripathi et al. | |
| 6,137,429 A * | 10/2000 | Chan et al. ................. | 341/143 |
| 6,208,279 B1 | 3/2001 | Oprescu | |
| 6,344,811 B1 | 2/2002 | Melanson | |
| 6,466,087 B1 | 10/2002 | Ruha | |
| 6,504,427 B1 | 1/2003 | Midya et al. | |
| 6,594,309 B1 | 7/2003 | Botti et al. | |
| 6,794,930 B1 | 9/2004 | Nurminen | |
| 6,795,004 B1 | 9/2004 | Masuda et al. | |
| 2004/0165661 A1 | 8/2004 | Braun | |

OTHER PUBLICATIONS

Jorge Varona, "Power Digital-to-Analog Conversion Using Sigma-Delta and Pulse Width Modulations," ECE1317 Analog Electronics II, ECE University of Toronto, pp. 1-14, 2001, no month.

Erik Bresch and Wayne T. Padgett, "TMS320C67-Based Design of a Digital Audio Power Amplifier Introducing Novel Feedback Strategy," Rose-Helman Institute of Technology, Electrical and Computer Engineering Department, pp. 1-16, 1999, no month.

K. P. Sozanski, R. Strzelecki and Z. Fedyczak, "Digital Control Circuit for Class-D Audio Power Amplifier," Power Electronics Specialists Conference, PESC 2001 IEEE 32nd Annual, vol. 2, pp. 1245-1250, 2001, no month.

Morten Johansen and Karsten Nielsen, "A Review and Comparison of Digital PWM Methods for Digital Pulse Modulation Amplifier (PMA) Systems," 107th Convention of Audio Engineering Society, Sep. 24-27, 1999, New York, New York.

Thomas Taul, Karsten Nielsen and Michael A.E. Andersen, "Comparing Nonlinear with Linear Control Methods for Error Correction in Switching Audio Amplifier Output Stages," 104th Convention of Audio Engineering Society, May 16-19, 1998, Amsterdam.

Karsten Nielsen, "MECC—A Novel Control Method for High End Switching Audio Power Amplification," 105th Convention of Audio Engineering Society, Sep. 26-29, 1998, San Francisco, California.

(Continued)

*Primary Examiner*—Lam T. Mai
(74) *Attorney, Agent, or Firm*—Ernest J. Beffel, Jr.; Haynes Beffel & Wolfeld LLP

(57) ABSTRACT

The present invention relates to digital-to-analog conversion. In particular, it has application to conversion of pulse code modulated signals, such as used in CDs and DVDs, to a pulse width modulated or analog signal.

16 Claims, 6 Drawing Sheets

OTHER PUBLICATIONS

Crilles Bak Rasmussen, "Hybrid Digital-Analog Feedback Audio Amplifiers," 2004 Dissertation, in cooperation with Bang & Olufsen ICEpower A/A, Lyngby 2004, Eksamensprojekt, NR. IMM-Thesis-2004-68, no month.

M. O. J. Hawksford, "Time-Quantized Frequency Modulation, Time-Domain Dither, Dispersive Codes, and Parametically Controlled Noise Shaping in SDM," J. Audio Eng. Soc., vol. 52, No. 6, pp. 587-617, Jun. 2004.

D. Weiler, P.A. Nielsen, D. Hammerschmidt, O. Machul and B.J. Hosticka, "Single Bit Sigma-Delta Modulator with Nonlinear Quantization for μ-Law Coding," 23rd European Sold-State Circuits Conference, Southhampton, United Kingdom, Sep. 16-18, 1997.

D. Akselrod, S. Greenberg, S. Hava and V. Koifman, "Noise-Shaped Dynamic Element Matching Architecture for Multibit Delta-Sigma Converters," no month no year.

E. Bach, "Multibit Oversampling D/A Converters Using Dynamic Element Matching Methods," Siemens AG, Semiconductors Group, Mar. 3, 1999.

E. Fogelman, "A Dynamic Element Matching Technique for Reduced-Distortion Multibit Quantization in Delta-Sigma ADCs," IEEE Transactions on Circuits and Systems-II: Analog and Digital Signal Processing, vol. 48, No. 2, Feb. 2001.

Y. Geerts and M. Steyaert, "Guidelines for Implementation of CMOS Multibit Oversampling Modulations," K.U. Leuven, ESAT-MICAS, Jan. 1999.

H. Jensen, "A Low-Complexity Dynamic Element Matching DAC for Direct Digital Synthesis," IEEE Transactions on Circuits and Systems-II: Signal Processing, vol. 45, No. 1, Jan. 1998.

\* cited by examiner

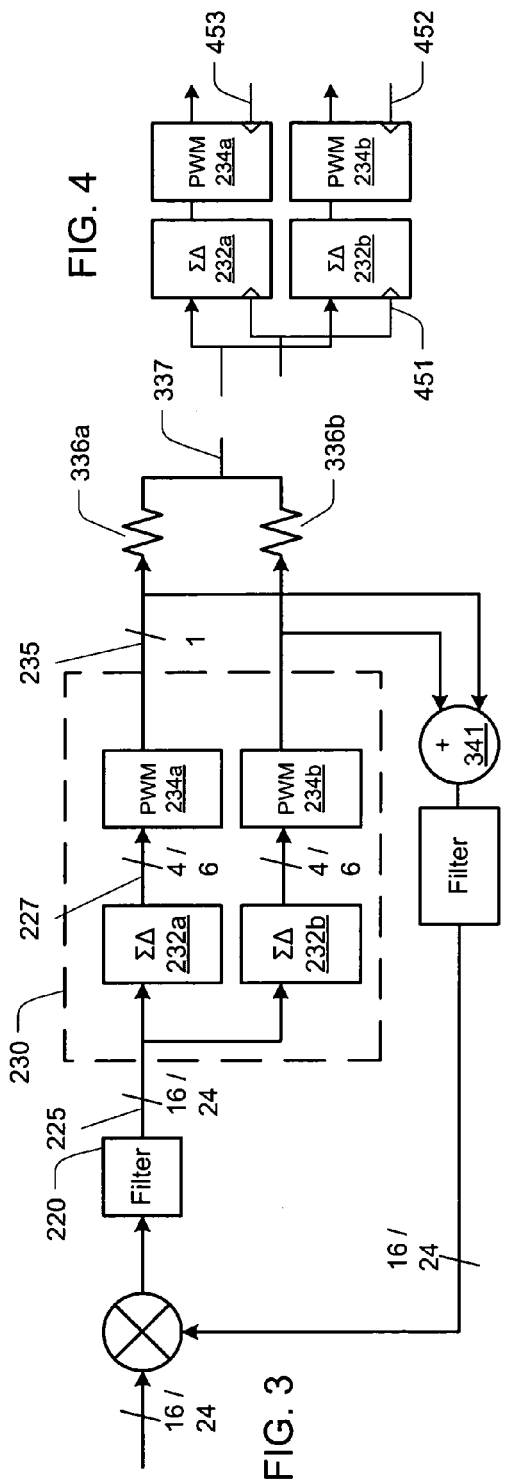
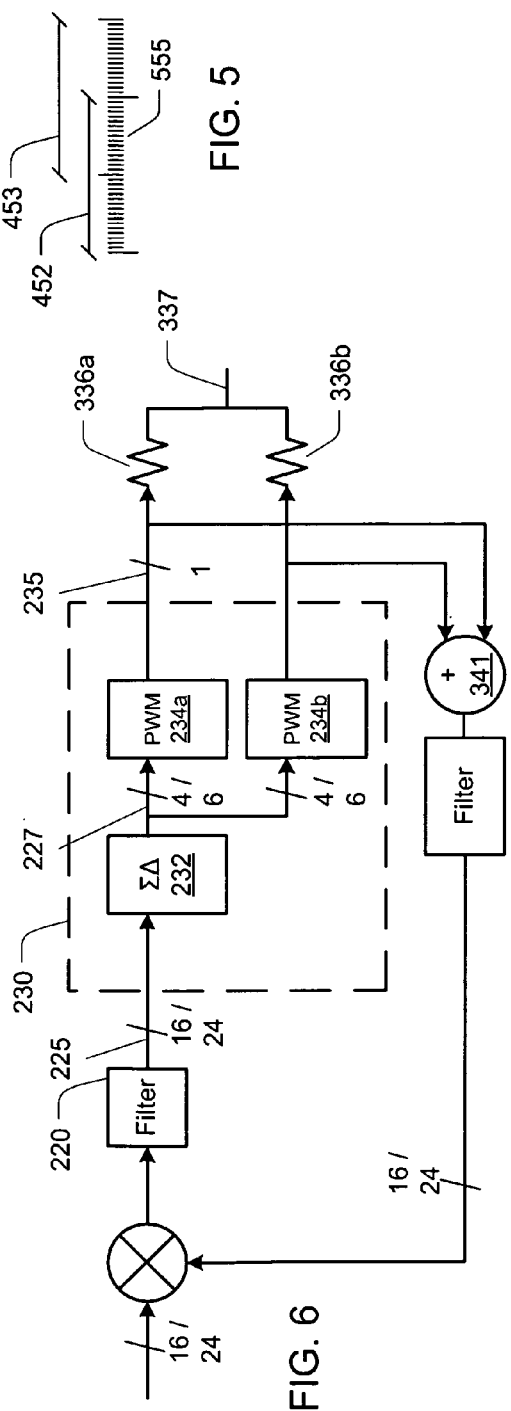

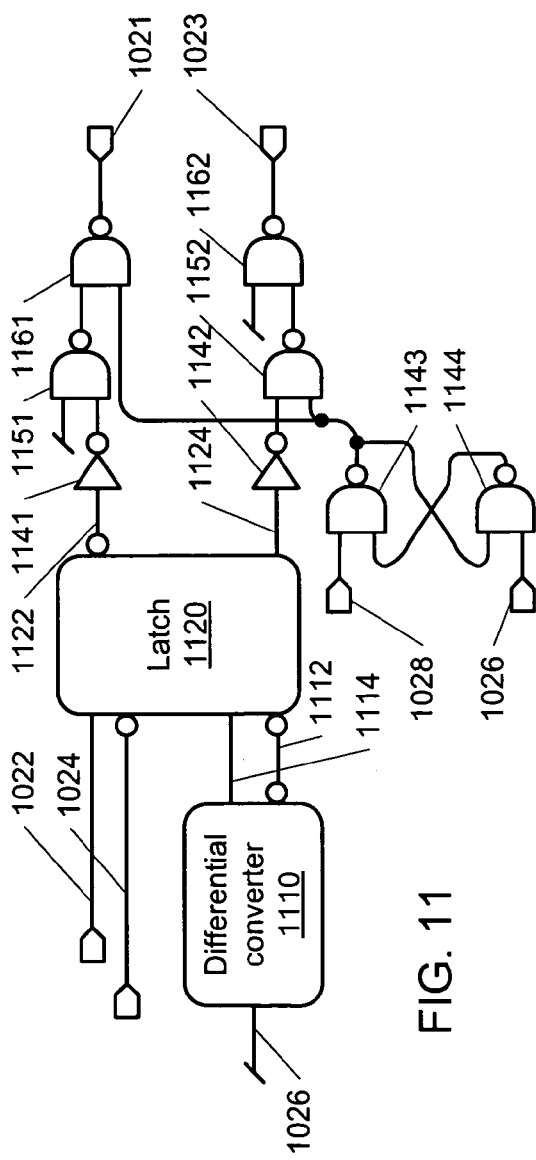
FIG. 11
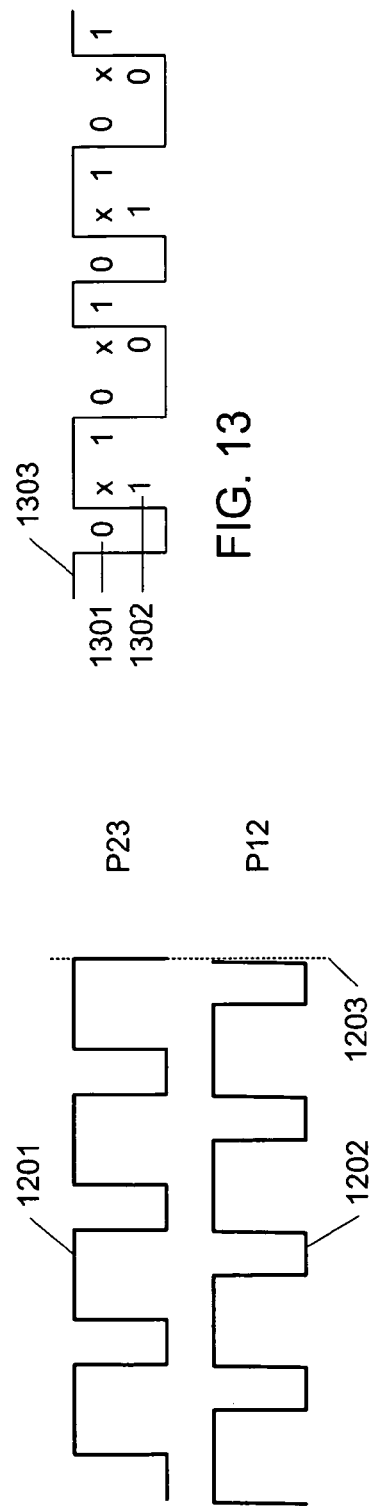
FIG. 13
FIG. 12

US 7,138,935 B1

LOW NOISE DIGITAL TO SIGNAL INTERVAL CONVERTER WITH AUDIO APPLICATIONS

RELATED APPLICATION

This application is related to U.S. patent application Ser. No. 10/621,504 filed Jul. 17, 2003 by Martin Mallinson, entitled "Device and Method for Signal Processing," which was at the time of both inventions obligated to be assigned to the same organization as this application. It is further related to a contemporaneously filed U.S. patent application Ser. No. 11/236,216, entitled "Low Noise Digital to Analog Converter with Audio Applications" filed Sep. 26, 2005 by inventors Dustin Forman, Martin Mallinson and Simone Damphousse, and U.S. patent application Ser. No. 11/236,215 entitled "Low Noise Digital to Pulse Width Modulated Converter with Audio Applications" filed Sep. 26, 2005 by inventors Martin Mallinson, Dustin Forman and Simone Damphousse. The related applications are incorporated by reference.

BACKGROUND OF THE INVENTION

The present invention relates to digital-to-analog conversion. In particular, it has application to conversion of pulse code modulated signals, such as used in CDs and DVDs, to a pulse width modulated or analog signal.

Many streaming media formats produce a multibit data stream. For instance, audio CDs typically encode music as a 16-bit or 24-bit pulse code modulated signal. MP3 files also may be decoded as pulse code modulated signals.

Audio fidelity depends in part on the signal to noise ratio (SNR) of the digital-to-analog (D/A) converter used. This converter may be part of a CD player, located on a sound card or included with powered speakers that are digitally driven. Manufacturers compete on the basis of the SNR achieved by their equipment. For instance, Creative Labs currently (in September 2005) advertises the Audigy Pro 4 sound card as achieving an SNR of 113 decibels in some modes.

Accordingly, an opportunity arises for new digital designs, especially digital designs that achieve strong signal-to-noise ratios.

SUMMARY OF THE INVENTION

The present invention relates to digital-to-analog conversion. In particular, it has application to conversion of pulse code modulated signals, such as used in CDs and DVDs, to a pulse width modulated or audio output. Particular aspects of the present invention are described in the claims, specification and drawings.

BRIEF DESCRIPTION OF THE DRAWINGS

FIGS. 3–6 relate to using two PWM modulators to produce one output signal. FIG. 3 pairs two PWM modulators with two sigma delta (ΣΔ) modulators.

FIG. 4 illustates the clocking of two ΣΔ and two pulse width modulators (PWMs).

FIG. 5 depicts the timing of paired ΣΔ and PWM modulators.

FIG. 6 links the two PWM modulators to one ΣΔ modulator to generates one combined output.

FIG. 11 is a block diagram of a restreaming unit.

FIG. 12 illustrates P12 and P23 timing signals.

FIG. 13 illustrates output of bit restreaming.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Audio sources such as CDs, DVDs and decoded file formats (MP3, AAC, etc.) typically produce pulse code modulated signals that represent an audio stream as a series of waveform samples. A standard CD, for instance, encodes music at sampling rate of 44.1 kHz with 16 bit integer values for each sample.

Closed Loop Digitally Filtered Embodiment

Figure 1:
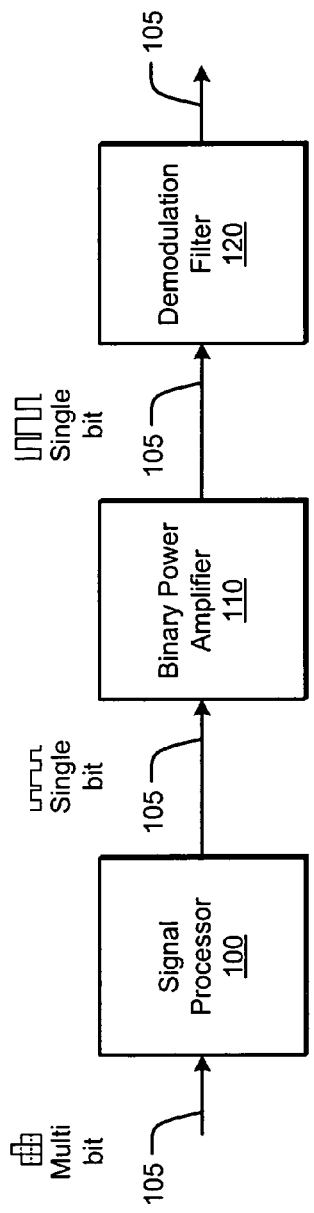
FIG. 1 depicts one approach to decoding and amplifying a signal.

In the earlier application that is incorporated by reference, background was provided that is, in part, repeated here. FIG. 1 depicts one approach to decoding and amplifying a signal. A multibit digital signal (sometimes referred to as wide-bit, for 16 or more bits per sample, e.g., 24 or 32 bits) 105 is received by a signal processor 100, which oversamples the input to a lower precision, taking samples at a high enough frequency to avoid loss of data, per the Nyquist theorem. A ΣΔ modulator is one example of an oversampling signal processor. A ΣΔ may produce a single or multibit output. The product of the ΣΔ clock rate and the number of bits output is always greater than or equal to the product of the input clock rate and the number of bits input. The signal processor may further covert the data format from an oversampled, bit pulse encoded (PCM) signal to a pulse width modulated (PWM) signal. One signal interval of a pulse width modulated signal may represent 32 or 64 values, dividing the signal interval in time proportionally to the value being represented. For instance, the signal may be high for 23 parts and low for 9 parts. A PWM signal has the desirable property, as compared to a ΣΔ modulator, of a reduced number of transitions between high and low (one transition per signal interval, as compared to as many transitions if the output of a ΣΔ modulator oscillates from high to low.) In fact, the frequency of rising (or falling) edges of the PWM signal is essentially fixed (with the reader understanding that some encodings may produce a saturated PWM signal, when the input signal is at full positive or negative amplitude.) A fixed frequency of rising edges is desirable.

The PWM signal 105 is suitable for processing by a Class D digital power amplifier, such as a binary power amplifier 110. Reducing the frequency of rising edges by PWM encoding the output of the ΣΔ modulator accommodates the maximum switching rate of the Class D amplifier. An amplified PWM signal is output 105. One or more demodulation filters 120 convert the amplified PWM signal, for instance, to an analog audio signal that drives speakers or head phones, either directly or as the input to further audio amplifiers, equalizers or other analog components.

Figure 2:
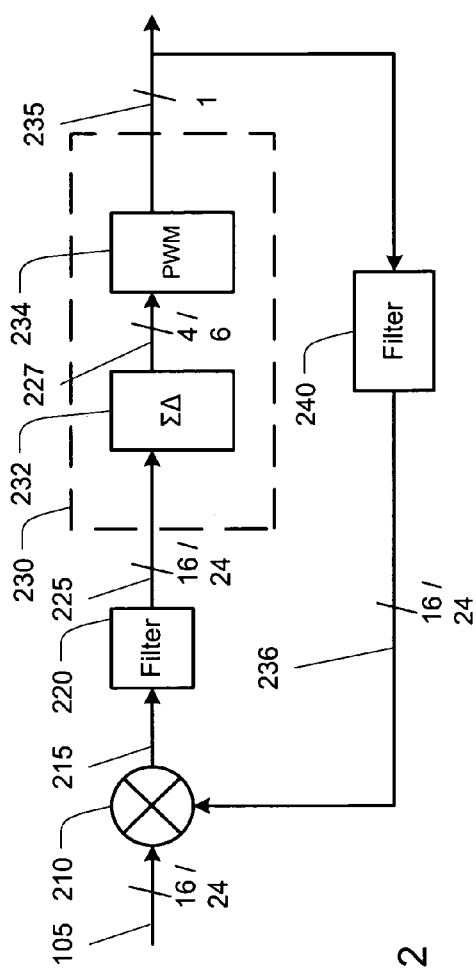
FIG. 2 is a block diagram of a processing system that accepts a wide-bit signal.

FIG. 2 is a block diagram of a processing system that accepts a wide-bit signal, such as a 16 or 24-bit signal and produces a PWM output that can be suitably filtered to produce an audio output. Verilog code implementing a circuit with these capabilities can be found in the earlier application incorporated by reference, FIGS. 7A–7D. This embodiment uses a feedback loop with a digital filter 240 that synchronously samples the pulse width modulated signal and converts it back to a format that can be combined with a version of the wide-bit input (current or delayed) to produce an error correction signal. The digital input signal 105 may be, for example, a 16-bit pulse code modulated signal sampled at 44.1 kHz. The digital filter 240 shown in FIG. 2 may help correct distortion created by the encoder stage 230 (and, more specifically, distortion created by the conversion from an oversampling filter 232 to a pulse width modulator 234.) The digital filter 240 of the embodiment synchronously samples each of the subintervals of the pulse width modulated signal 235 and uses a low pass filter to smooth the pulse width modulated digital signal 235 datastream.

The filter stage 220 may be a single digital integrator (e.g., a single pole filter with an origin pole). In this configuration, the filter stage 220 receives and accumulates any difference there may be between the digital input signal 205 and a filtered signal 236. Eventually, such filter stage 220 helps correct the difference to exactly or approximately zero (i.e., corrects the error to zero). Thus, in one embodiment, the transfer function of the filter stage may be an integrator—$H(s)=1/s$. A filter output signal 225 is sent to the encoder stage 230. The filter stage 220 may be a first, second or higher order element.

Alternatively, the filter stage 220 may be any input filter that combines an error correction signal with a version of the digital input signal 205. Instead of an origin pole, a filter can be devised with a finite pole that combines the correction signal with a version of the input signal.

The encoder stage 230 modulates the filter output signal 225 into a pulse width modulated signal 235. The encoder stage 230 of the embodiment depicted in FIG. 2 includes an oversampling filter 232 and a pulse width modulator 234. The oversampling filter 232 of such an embodiment may be, for example, a first order sigma-delta type modulator. The oversampling filter 232 may modulate the 16-bit filter output signal 225 at 44.1 kHz into a 4-bit oversampled signal 227 at 1.411 mHz (i.e., 32*44.1 kHz, which is also called "32x" oversampling). In other embodiments, the oversampling filter 232 may modulate a wide-bit signal (e.g., 12–24 bits) into a signal of only a few bits (e.g., 2–6 bits) or to a single bit. The oversampling filter 232 of such an embodiment may be implemented, for example, in a complementary metal oxide semiconductor (CMOS) process.

A sigma-delta modulator 232 of one embodiment may be able to express an amplitude at each sample over a small number of bits, while a pulse width modulator 234 may be able to express an amplitude at each cycle over a short amount of time. The sigma-delta modulator 232 may be very accurately representing the signal with a certain noise characteristic by generating the 4 bits at precise times. However, an unaugmented output signal from a pulse width modulator operating on an intermediate from a sigma-delta modulator may be unsatisfactory or undesirable, because the output signal may contain a significant amount of distortion. Such distortion is thought to be caused, at least in part, by the inability of a pulse width modulator to render a sample from the sigma-delta modulator at a precise time.

Mathematically, it is necessary for the bits output from the sigma-delta modulator 232 of one embodiment to be considered as being a good sample at the exact time of the clock that created them. However, although a pulse width modulator 234 may be accurate, it is not able to maintain the precise timing imparted by the ΣΔ modulator. For example, if the output of the pulse width modulator 234 is high for the first quarter of the period, a signal level of ¼ is represented. If the output of the pulse width modulator 234 is high for the last quarter of the period though, the signal level is also represented as ¼. Although both of these pulse modulator 234 states represent the same signal level (i.e., ¼ of the signal value), they do so at different times. This inability of the pulse width modulator 234 to render the sigma-delta sample at a precise time is thought to be, at least in part, the cause of distortion introduced by certain sigma-delta-to-pulse-width modulator encoding processes.

The pulse width modulator 234 of the embodiment shown in FIG. 2 converts the oversampled signal 227 (e.g., a 4-bit signal) from a pulse code modulated digital signal into a relatively small range of time values, such as a pulse width modulated digital signal 235. For example, if the stream of 4-bit data were to be used to control the pulse width modulator 234 such that a 4-bit sample represents the value "5," then the output of the pulse width modulator 234 would be in a high state for 5/16 of its period. In general, if 4-bit data is used to encode a value "N," then the output of the pulse width modulator 234 would be a high state for N/16 of its period. In such an embodiment, the pulse width modulator 234 may operate at a clock rate that is 16 times the rate of the 4-bit oversampled signal 227. This clock rate for the pulse width modulator 234 is M times the rate of the oversampling filter 232 (where M=16, and is the number of levels in the oversampled signal 227). In at least one embodiment, such a clock rate enables a proper variable pulse width output signal to be created.

The signal processing circuit 200 depicted in FIG. 2 also includes a feedback path. As shown in FIG. 2, the pulse width modulated signal 235 is fed into a digital filter 240 before being combined with (and in this case, subtracted from) the digital input signal 205 at a differencing point 210. In this way, the error signal that is fed to the filter stage 220 is the difference between the digital input signal 205 and a filtered signal 236. The digital filter 240 of the embodiment shown in FIG. 2 operates at the clock rate of the pulse width modulator 234, and therefore is able to sample the pulse width modulated output signal 235 at the same rate as the possible quantizations in time of that output.

For example, if the pulse width modulator 234 of one embodiment is running at a clock rate of 16 MHz, it may be able to process a 4-bit quantity over 16 clock cycles. To do so, this pulse width modulator 234 will expect to be provided with a 4-bit quantity at a clock rate of 1 MHz, and then over the next 16 clock cycles (i.e., over the next microsecond before the pulse width modulator 234 processes the next sample), the pulse width modulator 234 generates a pulse width modulated digital signal 235. If the digital filter 240 is operating at the same rate as the pulse width modulated quantizations in time are being received (in this example, a rate of 16 MHz), the digital filter 240 is able to synchronously sample every piece of mathematical information present in the pulse width modulated output signal 235. In particular, the digital filter 240 will receive a sample of every one of the possible positions in time of the pulse width modulated output signal 235, thereby allowing the digital filter 240 to measure the pulse width modulated output signal 235 with no error. Although the digital filter 240 is not able to appreciate anything happening faster than its clock rate, no information is lost because the pulse width-modulator 234 is also not able to change faster than this same clock rate. In this way, the digital filter 240 is able to capture every one of the bits of the pulse width modulated output signal 235.

The digital filter 240 of one embodiment is also able to resynthesize the output signal 235 into a wide-bit (e.g., 16-bit) representation of the output signal 235 to create a filtered signal 236, which is a pulse code modulated signal of the same bit width and clock rate as the digital input signal 205. This filtered signal 236 can then be subtracted from the digital input signal 205 to form an error signal. In one embodiment, the digital filter 240 uses a digital filter design to resynthesize the output signal 235 to form a wide-bit filtered signal 236. This digital filter 240 may be an integrator or recursive averager such as, for example, a simple IIR single pole filter (e.g., $y(n)=y(n-1)+a(x(n)-y(n-1))$, where "a" is a scaling factor such as $1/(2^9)$).

Although the embodiment shown in FIG. 2 includes a closed loop feedback path, it is to be understood that equivalent embodiments using, for example, a feed-forward path or other open loop circuit, may also be implemented.

The closed loop response of the embodiment shown in FIG. 2 is such that distortion from the encoder stage 230 is suppressed, and a number of favorable performance characteristics may be realized. For example, the embodiment described may exhibit a modulation depth of up to −1 db in the audio frequency band.

This embodiment may suppress errors in the pulse width modulation process such that THD is reduced to about 90–100 db for certain audio equipment applications. The embodiment shown in FIG. 2 is also able to suppress noise from oversampling filter 232. In particular, in an embodiment where the filter stage 220 is an integrator, the oversampling filter 232 is a first order sigma-delta modulator and the digital filter 240 is a first order filter, open loop noise introduced by the sigma-delta modulator 232 may be shaped to a first order (i.e., the noise goes down by 20 db per decade). However, the closed loop response of such an embodiment may suppress this noise by two more orders (i.e., one order from the filter stage 220 element and one order from the digital filter 240 element). In this way, such an embodiment may suppress noise from the oversampling filter 232 to the third order or higher (i.e., the noise falls by 60 db or more per decade).

Multiple PWM Embodiment

Figure 7:
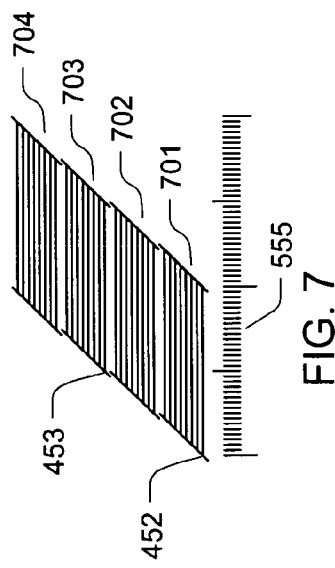
FIG. 7 illustrates the timing of 32 PWM modulators for a signal interval of 32 cycles.

Closed loop systems utilizing ΣΔ modulators, especially higher order systems, present instability challenges. These inventors worked with the system described above for some time before they considered using more than one PWM modulator 234 as depicted in FIGS. 3–5. By research and simulation, they determined that a PWM signal having an interval of 32 clock cycles (or 64) may benefit from a bank of 32 PWM modulators (or 64) operating with timing offsets. FIG. 7 illustrates the timing of 32 PWM modulators for a signal interval of 32 cycles. The x-axis scale 555 represents clock cycles. Consider interval 452 to be the signal interval of a first PWM modulator. Eight signal intervals 701 are staggered to start in eight succesive clock cycles, each interval lasting 32 clock cycles. Four groups of eight signal intervals, 701, 702, 703, 704, represent 32 signal intervals produced by 32 PWM modulators. Interval 453, for instance, represents the signal interval of the 17$^{th}$ PWM modulator. More detail is accessible from figures illustrating just two PWM modulators working in tandem.

FIGS. 3–6 relate to using two PWM modulators to produce one output signal. FIG. 3 pairs two PWM modulators 234a, 234b with two ΣΔ modulators 232a, 232b. FIG. 6 links the two PWM modulators 234a, 234b to one ΣΔ modulator 232 and generates one combined output. FIG. 4 illustates the clocking of two ΣΔ and two PWM modulators. FIG. 5 depicts the timing.

Most elements of FIG. 3 carry over the reference labeling of FIG. 2. Distinct to this figure are the dual ΣΔ and PWM modulators, plus two feedback paths coupled to a summation element 341 before the signal reaches the filter 240. Also illustrated are single-bit D/A converters 336a, 336b, which are joined to produce a combined output signal 337. The D/A converters may be simple resistors, RC circuits or another configuration. Output from a pair of resistors may be combined to an output signal that is ready to be capacitively smoothed.

The pulse with modulated outputs 235 of the pulse width modulators 234 are combined by summing component 341 and filtered as depicted in FIG. 2.

FIG. 4 depicts the clocking of the ΣΔ modulators and pulse width modulators. A first clock 451 drives sampling by the ΣΔ modulators 232a, 232b. The pulse width modulators produce signal intervals driven by separate clocks 452, 453. FIG. 5 illustrates the timing relationship of output from the pair of pulse width modulators. A scale 555 corresponds to the clock 451 of the ΣΔ modulators. The pulse width modulators are offset in operation from one another, as previously described in FIG. 7. In this illustration, the pulse width modulators generate signal intervals 452, 453 that are 32 cycles long. The figure illustrates a first signal interval generated by a first pulse width modulator offset by 16 clock cycles from the second signal interval.

Alternatively, FIG. 6 depicts driving a pair of pulse with modulators from the output of a single ΣΔ modulator 232. In other regards, FIG. 6 matches FIG. 3, except that only one ΣΔ modulator 232 is provided.

While FIGS. 3 & 6 depict just two pulse width modulators, they indicate how 32 or 64 pulse width modulators may be combined to produce an analog output. In such a configuration, the summing unit 341 may have 32 or 64 inputs of a single bit.

Edge Wave Embodiment

Figure 8:
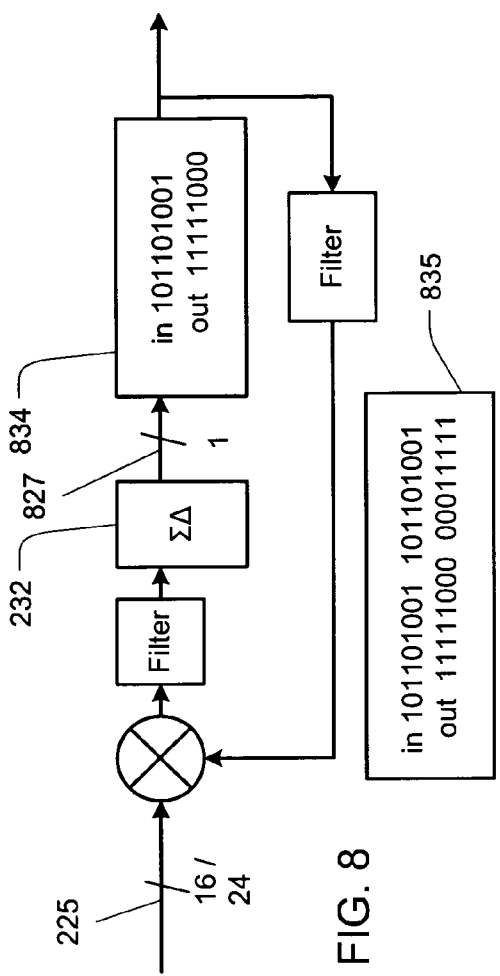
FIG. 8 depicts a so-called edge wave embodiment.

FIG. 8 depicts a so-called edge wave embodiment. This approach is illustrated as operating on a single bit output 827 of a ΣΔ modulator 232. It could be modified to operate on a multibit signal 827. In one embodiment 834, a series of bits are received and reordered so that the signal high bits are at the beginning, end or middle of an ordered string. This reordering correctly reflects the number of high bits in a particular interval, but does not exactly represent their timing. Accordingly, a digitally filtered feedback loop is used, as previously depicted and explained.

In an alternative embodiment 835, bit sequences are alternately reordered to have high bits first and then high bits last, or vice versa. The figure illustrates two input sequences, each including five ones. The output sequences have five ones, three zeros, three zeros and five ones. This two-phase reordering alternative maintains the desired fixed frequency of rising edges and decreases the number of rising edges by a factor of two.

Bit Restreaming Embodiment

Figure 9:
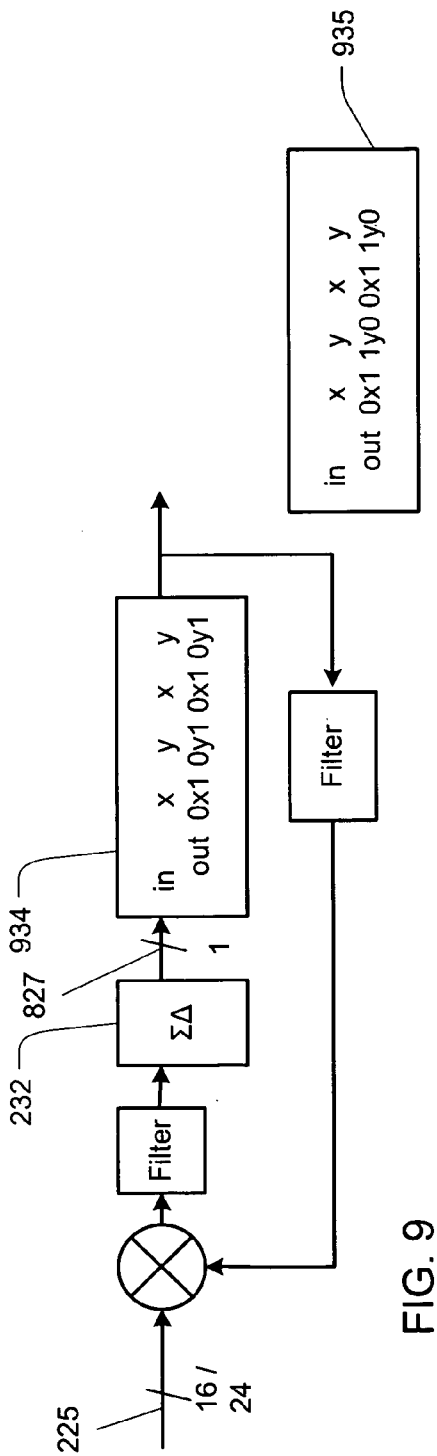
FIG. 9 depicts a so-called bit restreaming embodiment.

FIG. 9 depicts a so-called bit restreaming embodiment. This approach is illustrated as operating on a single bit output 827 of a ΣΔ modulator 232. It could be modified to operate on a multibit signal 827. In one embodiment, a base signal is generated with a place holders, having the pattern 0x1 0y1 0x1 0y1 or 1x0 1y0 1x0 1y0. Bits received from the ΣΔ modulator, x y x y, are inserted in the place holders in the base signal. The resulting signal has a fixed frequency of edges. Because it may introduce timing distortion, a digital feedback filter is applied.

An alternative embodiment 935 uses a different base signal pattern that reduces the frequency of rising edges. This pattern is generally of the form 0x1 1y0 0x1 1y0 and operates on bits received from the ΣΔ modulator, x y x y.

Figure 10:
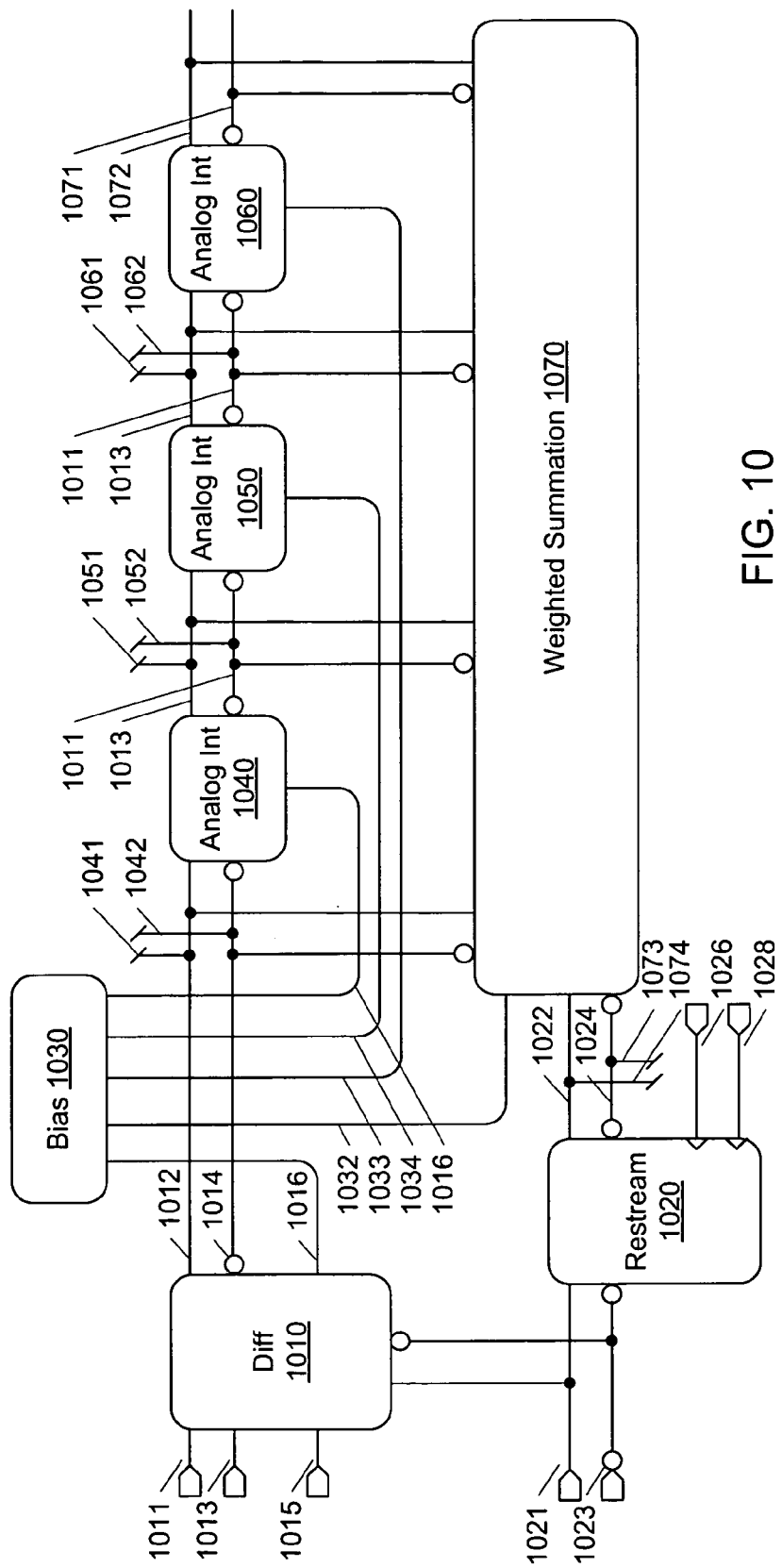
FIG. 10 is a high level block diagram of hardware including a restreaming unit.

Additional details are provided in FIGS. 10–13. In FIG. 10, the principal components in the figure are a bias resource 1030, a trio of analog integrators 1040, 1050, 1060, a differencing element 1010, a weighted summation element 1070 and a restreaming element 1020. The differencing element 1010 accepts an input signal 1013 and subtracts it from a pair of signals 1021, 1023 provided by the restreaming unit 1020. One of these signals is the inverse of the other. The differencing element converts the signal 1021 into a current and adds or subtracts it from the input signal. The outputs 1012, 1014, of the differencing unit 1010 are a differential signal that is fed into the chain of analog integrators. The remaining connection 1016 between the differencing unit 1020 and the bias resource 1030 is a bias. Associated with each analog integrator (e.g., 1040) are a pair of taps (1041, 1042) and a pair of outputs (1043, 1044). Outputs from the differencing unit and each of the analog integrators are coupled to the weighted summation element 1070. Different weights may be applied to the different connections. For instance, the weights applied to 1041, 1042 and to 1051, 1052 may be 20 units each; to 1061, 1062 may be 50 units; and to 1071, 1072 may be 100 units. The outputs 1022, 1024 of the weighted summation element 1070 are input to the restreaming element 1020. The restreaming element operates to accept the loop feedback signal and drive the error correction signals 1021 1023. The restreaming element may be a Dtype or other staticizing element, such as a clock quantizer. The restreaming unit uses two clock signals 1026, 1028 that are conveniently referred to as P12 and P23.

FIG. 12 illustrates the P12 and P23 clock signals. The signal P12 (1026, 1202) is high for the first two out of three time intervals. The signal P23 (1028, 1201) is high for the second and third intervals. Although it is not directly are relevant to the operation of the restreaming unit, we note that the signals are "not both low", so that, despite imperfections in rendering rising and falling signal edges, it is guaranteed that the pair signals will never be both low. This is depicted in FIG. 12 by reference line 1203. In practice, the hardware first takes the output that was low to high, and then takes the output that was high to low.

Details of the restreaming unit appear in FIG. 11. The main components are differential converter 1110, latch 1120 and numerous discreet logic elements 1141, 1151, 1161, 1142, 1152, 1162, 1143 and 1144. Input signals 1022, 1024, 1026, 1028 and output signals 1021, 1023 that we labeled in FIG. 10 are carried through to this figure. The unlabelled inputs to logic elements 1151, 1152 are both clock signal P23 (1028). The latch 1120 accepts the differential input signals and differential clock signals and drives the differential outputs. Apparently redundant inverters prevent kickback into the latch stage. If the differential clock signal 1112 is high and its inverse 1114 is low, the output state 1021 is fixed or frozen. In the opposite condition, wherein clock signal 1112 is low and its inverse is high, the output state 1021 follows the input state 1022. Analysis of this circuit will show that the output 1021 of this block follows the pattern depicted in FIG. 13. The base signal 1301 is filled in with the output from the over sampler 1302, resulting in the waveform 1303.

Logic Ring Embodiment

Figure 14:
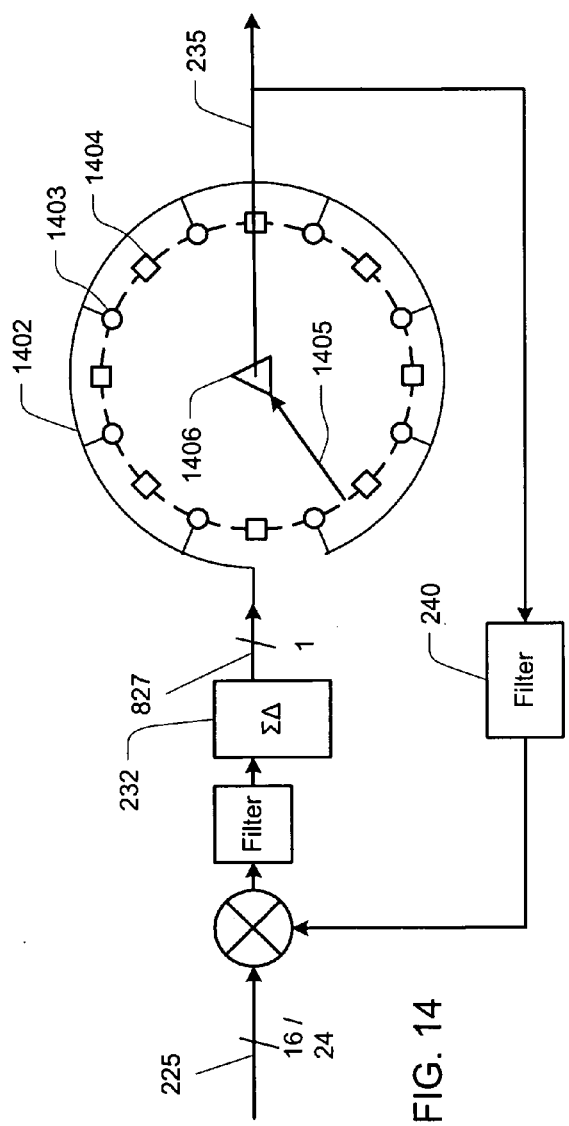
FIG. 14 is a high level block diagram of a logic ring embodiment.

FIG. 14 is a high level block diagram of a logic ring embodiment. A multi-bit input signal 827 is distributed 1402 to a series of combinatorial logic blocks 1403 that are indicated by circles. (Alternatively, a difference between input signals at t and t−1 can be calculated and distributed.) The squares 1404 are Dtype logic blocks corresponding to elements of a circular ordered set.

This single output embodiment is a variation on the multiple-output configuration described in the contemporaneously filed application. The single output is transmitted along spoke 1405 to hub 1406. The single output generates a wave form resembling a PWM signal, as high and low bits rotate past the single output spoke. This single output only effectively judges the length of the string on transitions at the head and tail of the string, as they go by. If the length of the string changes when the output is in the middle of the string or a position opposite to the middle of the string, it can change length again, even repeatedly, without the output sampling spoke noticing the changes.

The combinatorial logic blocks 1403 rotate a string among the Dtypes 1404 and shorten or lengthen the string as appropriate. A difference in string length is calculated from the input signal 1401, either in each block 1403 or commonly for distribution 1402 to all of the blocks. To handle rotation, a logic block can simply rotate a current Dtype value one position clockwise. To lengthen a string by adding one to the tail, a logic block detects the tail by finding a bit set in the next position clockwise and a bit unset in the next position counter clockwise. It either sets the Dtype in the counter clockwise position or inhibits the rotation of the unset bit from the counter clockwise position to the clockwise position, when the bit string rotates.

Because this conversion method and device introduce distortion, the single output 235 is processed through a digital filter 240 to produce an error correction signal, which is processed as in the prior embodiments.

Feed Forward Embodiments

The foregoing feedback embodiments can be adapted to feed forward a pre-correction using design adaptations know to digital designers. One adaptation is to duplicate the processing section that includes oversampling and PWM encoding in first and second stages and calculate an error correction signal at the end of the first stage, This error correction is applied to a buffered copy of the input signal that is fed forward, bypassing the first stage. The second stage processes the corrected input signal and outputs a result.

Figure 15:
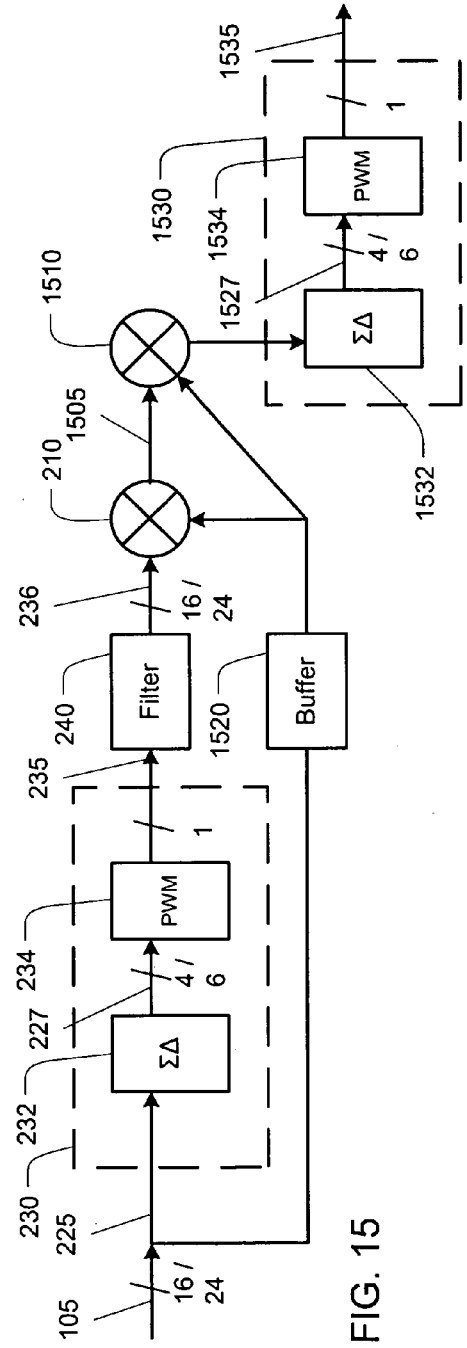

FIG. 15 depicts the reordering of elements from FIG. 2 into a general feed forward configuration. The elements shared by FIGS. 2 & 15 retain the reference numbers from FIG. 2. The initial integrator 220 is replaced by a buffer 1520 and a summing element 1510 combine with the repositioned differencing element 210 to calculate the error correction term 1505 and apply it. The buffer matches the processing of a version of the input signal to calculation of the pre-correction signal 1505. The corrected signal 1505 is fed forward into a second processing block 1530, which may include at least one ΣΔ modulator 1532 that produces at least one oversampled signal 1527 that is received by a PWM modulator 1534. An output signal 1535 is produced from the pre-corrected input 1505.

Some Particular Embodiments

The embodiments disclosed may be practiced as a method or device adapted to practice the method. The embodiments also may take the form of an article of manufacture, such as media impressed with logic to correct distortion caused by transforming an oversampled pulse code modulated signal to a pulse width modulated signal. Or, the article of manufacture may be media impressed with logic to build an integrated circuit carrying out any of the methods described or any of their aspects.

One embodiment is a loop that corrects distortion caused by transforming an oversampled pulse code modulated signal. This loop operates on a wide-bit signal, and includes a differencing element accepting the wide-bit signal and an input filter coupled to the differencing element. It further includes at least one over sampler, such as a sigma delta modulator, coupled to the input filter, producing at least one oversampled signal having less precision and higher frequency than the wide-bit signal. A plurality of pulse width modulators are coupled to the over sampler, the operation of pulse width modulators being offset in time. A plurality of outputs are coupled to the pulse width modulators, as well as at least one digital filter. The digital feedback filter produces a correction signal but at least partially compensates for distortion produced by the pulse width modulators and formats the correction signal to match precision and frequency of the wide-bit input signal. The formatted correction signal is fed back to the differencing element.

According to one aspect of this embodiment, the input filter is an integrator that combines an instance of the wide-bit input signal with an instance of output from the differencing element, the differencing element output coming from another instance of the wide-bit input signal and an instance of the formatted correction signal.

According to another aspect of this embodiment, the pulse width modulators have a precision of M values per pulse width interval and at least M pulse width modulators are coupled to the over sampler. The M pulse width modulators operate offset in time, so the pulse width intervals generated by them began at M distinct times.

Either feedback or feed forward can be used. Another embodiment is a loop that corrects distortion caused by transforming an oversampled pulse code modulated signal to a pulse width modulated signal. It operates on a wide-bit input signal and includes an input buffer coupled to the wide-bit input signal and an over sampler coupled to the input signal, producing an oversampled signal having less precision and higher frequency than the wide-bit signal. A plurality of pulse width modulators are coupled to the over sampler. The operation of the pulse width modulators is offset in time. At least one digital feed forward filter is coupled to the pulse width modulators. This digital feed forward filter produces a correction signal that at least partially compensates for distortion introduced by the pulse width modulators and formats the correction signal to match precision and frequency of the wide-bit input signal. It feeds forward the formatted correction signal to a differencing element that also is coupled to the input buffer.

According to one aspect of this embodiment, the loop further includes a second processing block comprising a second over sampler, which is coupled to the differencing element and to one or more second pulse width modulators. According to another aspect, the loop further includes a second processing block comprising a second over sampler, which is coupled to the differencing element and to a second plurality of pulse width modulators. The operation the second pulses width modulators is offset in time.

Another embodiment is a method of reducing distortion caused by transforming an oversampled, wide-bit pulse code modulated signal to a pulse width modulated signal representing M values per signal interval. This method includes distributing one or more oversampled signals to a plurality of pulse width modulators, the operation of the pulse width modulators being offset in time and distributed over and portions of the signal interval, the pulse width modulators introducing distortion. The method further includes digitally filtering pulse width modulated signals from the pulse width modulators. This filtering produces a correction signal that at least partially compensates for the distortion introduced by the pulse width modulators and formats the correction signal to match precision and frequency of the white-bit input signal. The method further includes combining the correction signal with a version of the wide-bit input signal to produce a corrected signal and processing the corrected signal through oversampling and pulse width modulation elements to produce a compensated pulse width modulated signal.

According to one aspect of this embodiment, at least M pulse width modulators are used.

Another embodiment is a method of reducing distortion caused by transforming an oversampled, wide-bit pulse code modulated signal to a pulse width modulated signal representing M. values per signal interval. This method includes distributing one or more oversampled signals to at least M pulse width modulators, the operation of the pulse width modulators being offset in time and distributed over M portions of the signal interval. The pulse width modulators introduce distortion. The method further includes digitally filtering pulse width modulated signals from the pulse width modulators. This filtering includes producing a correction signal that at least partially compensates for the distortion introduced by the pulse width modulators and formatting the correction signal to match precision and frequency of the wide-bit input signal. The method further includes combining the correction signal with a version of the wide-bit input signal to produce a corrected signal and processing the corrected signal through oversampling and pulse width modulation to produce a compensated pulse width modulated signal.

According to one aspect of this embodiment, combining the correction signal with the version of the wide-bit input signal includes summing the correction signal with a version of the wide-bit input signal to produce an error compensation signal and integrating the error compensation signal with a delayed version of the white-bit input signal to produce the corrected signal.

Another aspect of this embodiment involves processing the corrected signal by feedback through oversampling and pulse width modulator components used to produce the pulse width modulated signals from the at least M pulse width modulators.

Another device embodiment is a loop that corrects distortion caused by transforming an oversampled pulse code modulated signal to a pulse width modulated signal. This loop operates on a wide-bit input signal. It includes a differencing element accepting the wide-bit input signal and an input filter coupled to the differencing element. It further includes an over sampler coupled to the input filter, producing an oversampled signal having less precision and higher frequency than the wide-bit signal. It includes at least M pulse width modulators coupled to the over sampler, the pulse width modulators having a precision M per pulse width interval and operating offset in time, so that the pulse width intervals of the M pulse width generators begin at M distinct times. It further includes a plurality of outputs coupled to the pulse width modulators and a digital feedback filter coupled to the pulse width modulators. The digital feedback filter produces a correction signal that at least partially compensates for distortion introduced by the pulse width modulators, formats the correction signal to match precision and frequency of the wide-bit input signal and feeds back the formatted corrected signal to the differencing element.

Another embodiment is a method of converting a multi-bit digital input signal into a digital signal with a fixed frequency of rising edges. This method includes oversampling a wide-bit input signal to one-bit samples and processing a number S of samples from the oversampling, the number S corresponding to an output signal precision. The method further includes determining proportions of high and low signal values among the S samples and outputting a signal interval with a single transition between its ends between high and low signal values, proportions of the interval at high and low signal values corresponding to the determined proportions of high and low signal values among the S samples.

An aspect of this embodiment further includes digitally filtering a stream of the signal intervals, the digital filter producing a correction signal that at least partially compensates for distortion introduced by translating the S samples to signal intervals and formatting the correction signal to match precision and frequency of the wide-bit input signal. This aspect further includes combining the formatted correction signal with a version of the wide-bit input to produce a corrected signal.

An aspect of this embodiment further includes feeding back the formatted correction signal to the wide-bit input and integrating a resulting difference value with at least one earlier wide-bit input.

Another embodiment is the method of converting a multi-bit digital input signal into a digital signal with a fixed frequency of rising edges. This method includes oversampling a wide-bit input to produce samples and generating a base signal that has at least one placeholder for receiving a value from one of the samples. The base signal produces a fixed frequency of rising edges, regardless of the value placed in the placeholder. The method further includes filling the placeholder with the value and outputting a resulting signal with a fixed frequency of rising edges.

According to one aspect of this embodiment, the base signal has one high signal value and one low signal value with the placeholder holder in between the high and low signal values. In an alternative aspect of this embodiment, the base signal as two high signal values, two low signal values and two placeholders in the pattern: x1yy2x; that is, first signal value-first placeholder-second signal value-second signal value-second place holder-first placeholder.

Yet another aspect of this embodiment includes digitally filtering a stream of the resulting signals. The digital filter produces a correction signal that at least partially compensates for distortion introduced by combining the values with the base signal. The digital filtering also includes formatting the correction signal to match precision and frequency of the wide-bit input signal. This aspect further includes combining the formatted correction signal with a version of the wide-bit input to produce a corrected signal.

A further aspect of this embodiment includes feeding back the formatted conversion signal to the wide-bit input and integrating a resulting difference value with at least one earlier wide-bit input.

While the present invention is disclosed by reference to the preferred embodiments and examples detailed above, it is understood that these examples are intended in an illustrative rather than in a limiting sense. Computer-assisted processing is implicated in the described embodiments. It is contemplated that modifications and combinations will occur to those skilled in the art, which modifications and combinations will be within the spirit of the invention and the scope of the following claims.

We claim:

1. A method of converting a wide-bit digital input signal into a digital signal with a fixed frequency of rising edges, the method including:
   oversampling a wide-bit input signal to one-bit samples;
   processing a number S of samples from the oversampling, the number S corresponding to an output signal precision;
   determining proportions of high and low signal values among the S samples; and
   outputting a signal interval having a fixed frequency of rising edges, proportions of the signal interval at high and low signal values corresponding to the determined proportions of high and low signal values among the S samples.

2. The method of claim 1, further including
   digitally filtering a stream of the signal intervals, the digital filter
      producing a correction signal that at least partially compensates for distortion introduced translating the S samples to a signal interval and
      formatting the correction signal to match precision and frequency of the wide-bit input signal; and
   combining the formatted correction signal with a version of the wide-bit input to produce a corrected signal.

3. The method of claim 2, further including feeding back the formatted correction signal to the wide-bit input and integrating a resulting difference value with at least one earlier wide-bit input.

4. The method of claim 2, wherein there is has a single transition between high and low signal values within the signal interval.

5. An integrated circuit including logic and resources adapted to carry out the method of claim 1.

6. A machine readable memory impressed with instructions to carry out the method of claim 1.

7. A machine readable memory impressed with instructions to produce an integrated circuit having logic and resources adapted to carry out the method of claim 1.

8. A method of converting a wide-bit digital input signal into a digital signal with a fixed frequency of rising edges, the method including:
   oversampling a wide-bit input to produce samples;
   generating a base signal that has at least one place holder for receiving a value from one of the samples, the base signal producing a fixed frequency of rising edges, regardless of the value;
   filling the place holder with the value; and
   outputting a resulting signal with a fixed frequency of rising edges.

9. The method of claim 8, wherein the base signal has one high signal value and one low signal value with the placeholder in between the high and the low signal values.

10. The method of claim 8, wherein the base signal has one high signal value, one low signal value and two placeholders in a pattern (x1y2) of first signal value-first place holder-second signal value-second place holder.

11. The method of claim 8, wherein the base signal has two high signal values, two low signal values and two placeholders in a pattern (x1yy2x) of first signal value-first place holder-second signal value-second signal value-second place holder-first place holder.

12. The method of claim 8, further including:
digitally filtering a stream of the resulting signals, the digital filter
producing a correction signal that at least partially compensates for distortion introduced by combining the values with the base signal and
formatting the correction signal to match precision and frequency of the wide-bit input signal; and
combining the formatted correction signal with a version of the wide-bit input to produce a corrected signal.

13. The method of claim 12, further including feeding back the formatted correction signal to the wide-bit input and integrating a resulting difference value with at least one earlier wide-bit input.

14. An integrated circuit including logic and resources adapted to carry out the method of claim 8.

15. A machine readable memory impressed with instructions to carry out the method of claim 8.

16. A machine readable memory impressed with instructions to produce an integrated circuit having logic and resources adapted to carry out the method of claim 8.

* * * * *